(12) United States Patent
Quek et al.

(10) Patent No.: US 7,285,804 B2
(45) Date of Patent: Oct. 23, 2007

(54) THYRISTOR-BASED SRAM

(75) Inventors: Elgin Quek, Singapore (SG); Jia Zhen Zheng, Singapore (SG); Pradeep R. Yelehanka, Singapore (SG); Weining Li, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 404 days.

(21) Appl. No.: 11/077,731

(22) Filed: Mar. 10, 2005

(65) Prior Publication Data

US 2005/0167664 A1 Aug. 4, 2005

Related U.S. Application Data

(62) Division of application No. 10/629,041, filed on Jul. 28, 2003, now Pat. No. 6,897,111.

(51) Int. Cl.
*H01L 21/332* (2006.01)
(52) U.S. Cl. .............. 257/133; 257/124; 257/E29.213; 438/133; 438/151

(58) Field of Classification Search .............. 257/124, 257/133; 438/133, 151
See application file for complete search history.

(56) References Cited

U.S. PATENT DOCUMENTS 7,135,745 B1 * 11/2006 Horch et al. ............... 257/368

* cited by examiner

*Primary Examiner*—Dung A. Le
(74) *Attorney, Agent, or Firm*—Mikio Ishimaru; William D. Zahrt, II

(57) ABSTRACT

An integrated circuit structure includes a semiconductor substrate and a horizontal semiconductor fin on top of the semiconductor substrate. An access transistor gate and a thyristor gate are on top of the semiconductor substrate and in contact with the horizontal semiconductor fin. An access transistor is at least a portion of the horizontal semiconductor fin and the access transistor gate. A thyristor is at least a portion of the horizontal semiconductor fin and the thyristor gate, the access transistor is in contact with the thyristor.

10 Claims, 9 Drawing Sheets

THYRISTOR-BASED SRAM

CROSS-REFERENCE TO RELATED APPLICATION

This is a divisional of application Ser. No. 10/629,041, filed Jul. 28, 2003, U.S. Pat. No. 6,897,111, which is hereby incoporated by reference herein.

TECHNICAL FIELD

The present invention relates generally to semiconductor integrated circuit devices and methods for the production thereof, and more particularly to thyristor-based SRAM devices.

BACKGROUND ART

Electronic equipment, such as televisions, telephones, radios, and computers, is constructed using semiconductor microprocessors, integrated circuits, memory chips, and the like. These semiconductor components are typically fabricated on a semiconductor substrate and are constructed using various microelectronic devices such as transistors, capacitors, diodes, resistors, and so forth. Each microelectronic device is typically a pattern of conductor, semiconductor, and insulator regions formed on the semiconductor substrate.

The electronics industry continues to strive for increasingly higher-powered and higher-functioning circuits. Improvements continue to be made in device miniaturization and in the creation of multifunction devices on single semiconductor chips or dies.

Very large-scale integrated circuits on small areas of silicon wafers are manufactured through a series of steps carried out in a particular order. The main objectives include obtaining a device that occupies as small an area as possible and consumes low levels of power using low supply voltage levels, while performing at speeds comparable to speeds realized by much larger devices.

An important part in the circuit construction and manufacture of semiconductor devices concerns data storage, or semiconductor memories, which is the circuitry used to store digital information. The construction and formation of such memory circuitry typically involves forming at least one storage element and forming associated circuitry designed to access the stored information. In applications where circuit space, power consumption, circuit speed, and reliability are primary design goals, the construction and layout of memory devices can be very important.

Dynamic read/write random-access memory ("DRAM") is a type of volatile memory in which the data stored at each location is periodically refreshed by reading it and then writing it back again to the same location, or else it disappears. Static read/write random-access memory ("SRAM") is a type of volatile memory in which the data, once it is written to a memory location, remains stored there as long as power is applied to the memory chip (unless, of course, the data is deliberately changed by replacing it with new data).

SRAM and DRAM often compromise one or more of the primary design goals of smaller circuit space, lower power consumption, and faster circuit speed. For instance, some SRAMs include circuit structures that compromise at least one of these primary design goals. An example is a conventional SRAM based on a four-transistor ("4T") cell, or a six-transistor ("6T") cell, that has four cross-coupled transistors or two transistors and two resistors, plus two cell-access transistors. Such cells have the advantage that they are compatible with mainstream complimentary metal oxide semiconductor ("CMOS") technology, consume relatively low levels of standby power, operate at low voltage levels, and perform at relatively high speeds. However, the 4T and 6T cells are conventionally configured using a large cell area, and this large area significantly and undesirably limits the maximum density of such SRAMs.

Other SRAM cell designs are based on negative differential resistance ("NDR") devices. These usually consist of at least two active elements, including the NDR device. The structure and operating characteristics of the NDR device are particularly important to the overall performance of this type of SRAM cell. A variety of NDR devices has been introduced, ranging from a simple bipolar transistor to complicated quantum-effect devices. The biggest advantage of the NDR-based memory cell is the potential of having a cell area smaller than that of 4T and 6T memory cells because of the smaller number of active devices and interconnections needed in the NDR design.

Conventional NDR-based SRAM cells, however, have many problems that have inhibited their use in commercial SRAM products. Some of these problems include: high standby power consumption due to the large current needed in one or both of the stable memory states of the cell; excessively high or excessively low voltage levels needed for the cell operation; stable states that are too sensitive to manufacturing variations and provide poor noise-margins; limitations in access speed due to slow switching from one stable state to the other; and manufacturability and yield issues due to complicated fabrication processing.

One NDR device is the "thyristor" (from the Greek thyra, meaning "door", which suggests something that is either open or closed, and thus either on or off). Thyristors are widely used in power switching applications because the current densities carried by such devices can be very high when in their "on" state.

A thyristor is a four-layer semiconductor device consisting of alternating N-type and P-type semiconductor materials (i.e., "NPNP"), with three P-N junctions. Thyristors usually have three electrodes: an anode, a cathode, and a gate (or control electrode).

A thyristor can be turned on by an initial current at the gate, and once it is turned on, it then does not require any more control (gate) current to continue to conduct. Instead, it will continue to conduct until a minimum holding current is no longer maintained between the anode and cathode, or until the voltage between the anode and the cathode is reversed.

A thyristor can thus switch or control large amounts of power using but a small triggering (or control) current or voltage. Thyristors, then, act like a semiconductor analog of a mechanical switch—the two stable states are "on" and "off," with nothing in between. Thyristors are used, among many applications, in motor speed controls, light dimmers, pressure-control systems, and liquid-level regulators.

For use in electronic applications, however, a significant difficulty with thyristor devices is that once switched to their on state, they remain in this state until the current is reduced below the device holding current. Also, in general, when the main thyristor current is interrupted (to turn the thyristor off), the time required for the thyristor to return to the off state is largely determined by the lifetimes of the current carriers in the device, and in electronic terms this can be quite long.

This inability to switch the device off without interrupting the current, and the associated slow switching speed, are significant problems in many applications and have resulted in many attempts to modify the device structures so that they can be actively and rapidly switched off.

A prior design directed to these concerns appears in U.S. Pat. Nos. 6,229,161 and 6,448,586 (both to Nemati et al.). The descriptions are directed to capacitively-coupled NDR devices such as thyristors, and to circuit applications for such structures. These devices are described as having advantages for use in designs that need NDR devices having improved on/off switching speeds and a low holding current when in the on state. They are said to be unlike many NDR devices such as conventional thyristor structures that slowly turn off due to the saturation of their junctions in the on state, and/or that may not turn off at all until the current is reduced below the holding current. Instead, the devices in these patents are directed to capacitively-coupled thyristor devices that quickly switch between a current-passing mode and a current-blocking mode in response to a capacitively-coupled activation signal that is presented adjacent a particular region of the capacitively-coupled NDR device. The switch or change from one state to the other occurs using a relatively low voltage, and the devices can be implemented in a relatively small area.

A thyristor-based random access memory ("T-RAM") array having a plurality of such T-RAM cells could have a density equivalent to that of DRAM arrays and a speed equivalent to that of SRAM arrays. Hence, such a T-RAM array could provide the advantages afforded by both SRAM and DRAM arrays. These advantages make such a T-RAM attractive for possible use in future generations of high-speed, low-voltage, and high-density memories.

However, the T-RAM cell disclosed in these patents presents several major drawbacks. For example, the entire thyristor is formed in a vertical silicon pillar, requiring epitaxial processing to form the vertical configuration. This is not compatible with conventional bulk CMOS processing.

In addition, the thyristor SRAM cell (T-RAM) sits in a P– well in a bulk silicon ("Si") substrate. This results in a large difference in elevation between the contact on the top P+ region of the thyristor and other contacts in the device. Accordingly, there can be difficulty etching contacts due to this large elevation difference between the contact on the top of the Si pillar and those on planar devices.

Also, additional masking and implantation steps are needed for the thyristor N+ region, the thyristor-top P+ implantation, and the thyristor N– region.

An additional thermal step is needed to diffuse the thyristor-bottom N+ region.

There is also potential incompatibility with salicidation. Additionally, difficulties can arise in controlling the dimensions of the vertical pillar and reproducing these dimensions for each T-RAM cell in a T-RAM array.

Also, due to the existence of a vertical thyristor in each T-RAM cell, the T-RAM cells as a whole are not planar and are therefore difficult to scale to larger configurations.

Additionally, since each T-RAM cell is fabricated prior to or after fabricating other devices (such as positive-channel metal-oxide semiconductor ("PMOS") and negative-channel metal-oxide semiconductor ("NMOS") supporting devices) that are connected to it, extra fabrication steps and increased manufacturing costs are incurred.

Thus, while there is a growing trend to realize an SRAM cell by using the T-RAM combination of an NPNP junction connected to an NMOS transistor for ultra-high cell density, the incompatibility with conventional bulk CMOS processing makes such embedded SRAM design difficult.

Solutions to these problems have been long sought but prior developments have not taught or suggested any solutions and, thus, solutions to these problems have long eluded those skilled in the art.

DISCLOSURE OF THE INVENTION

The present invention provides an integrated circuit structure. A semiconductor substrate is provided and a horizontal semiconductor fin is on top of the semiconductor substrate. An access transistor gate and a thyristor gate are on top of the semiconductor substrate and in contact with the horizontal semiconductor fin. An access transistor is at least a portion of the horizontal semiconductor fin and the access transistor gate. A thyristor is a portion of the horizontal semiconductor fin and the thyristor gate, such that the access transistor is in contact with the thyristor. These are ultra-high cell density devices using conventional technologies in a straightforward, economical, uncomplicated, and highly versatile process.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. Also, the drawings showing embodiments of the apparatus are semi-diagrammatic and not to scale and, particularly, some of the dimensions are for the clarity of presentation and may be shown exaggerated in the FIGs.

The term "horizontal" as used herein is defined as a plane parallel to the conventional plane or surface of a wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
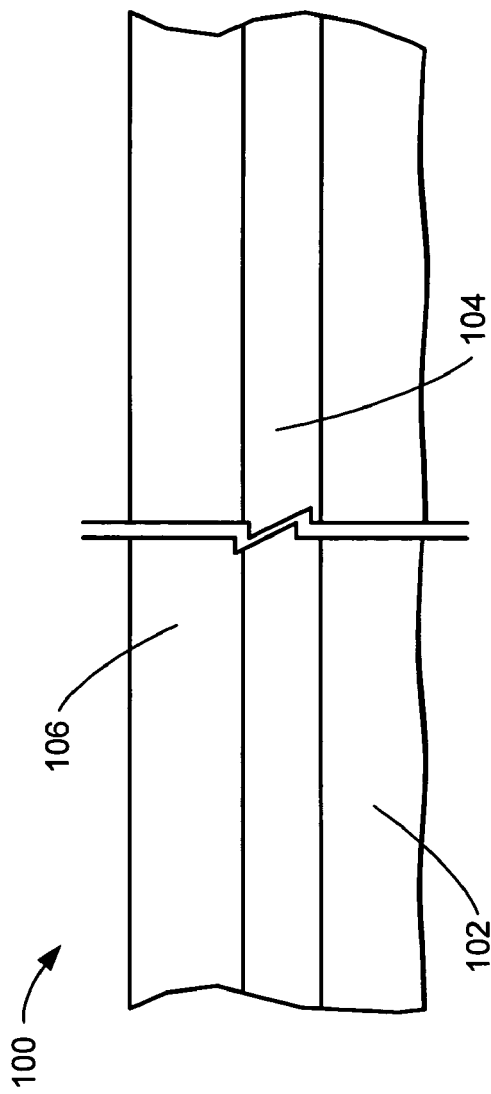
FIG. 1 is a cross-sectional view of a silicon wafer in the first stages of processing in accordance with the present invention.

Referring now to FIG. 1, therein is shown a cross-sectional view of a wafer 100, typically of silicon ("Si"), in the first stages of processing to fabricate a horizontal static read/write random-access memory ("SRAM"). The SRAM memory, formed using a quasi-planar double gate field effect transistor ("FinFET") process, is a thyristor-based random access memory ("T-RAM"). The thyristor is a negative differential resistance ("NDR") device having alternating N-type and P-type ("NPNP") semiconductor materials.

As shown in FIG. 1, the wafer 100 is a P-type silicon-on-insulator ("SOI") wafer having a silicon ("Si") base 102. Formed in the Si base 102 is a buried silicon oxide ("BOX") layer 104. In the BOX layer 104, in turn, is formed a Si layer 106. The Si base 102, the BOX layer 104, and the Si layer 106, together, comprise a conventional SOI configuration.

Figure 2:
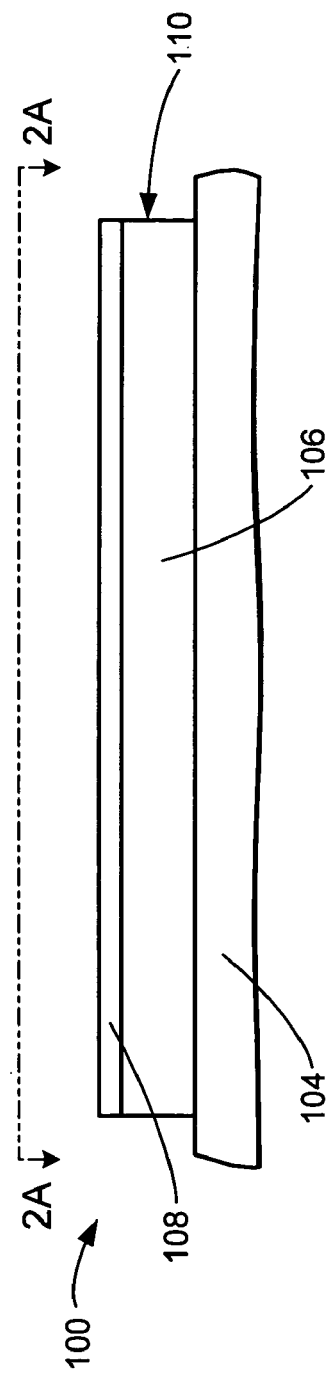
FIG. 2 is a cross-sectional view of a portion of the structure of FIG. 1, taken generally on line 2-2 of FIG. 2A, after reduction by oxidation of the silicon layer thickness, and deposition of a hardmask.
Figure 2B:
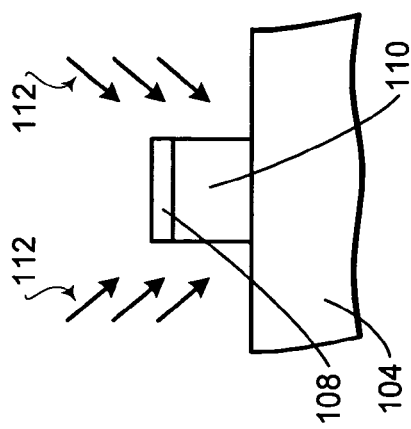
FIG. 2B is a cross-sectional view of the structure of FIG. 2A taken on line 2B-2B of FIG. 2A.
Figure 2A:
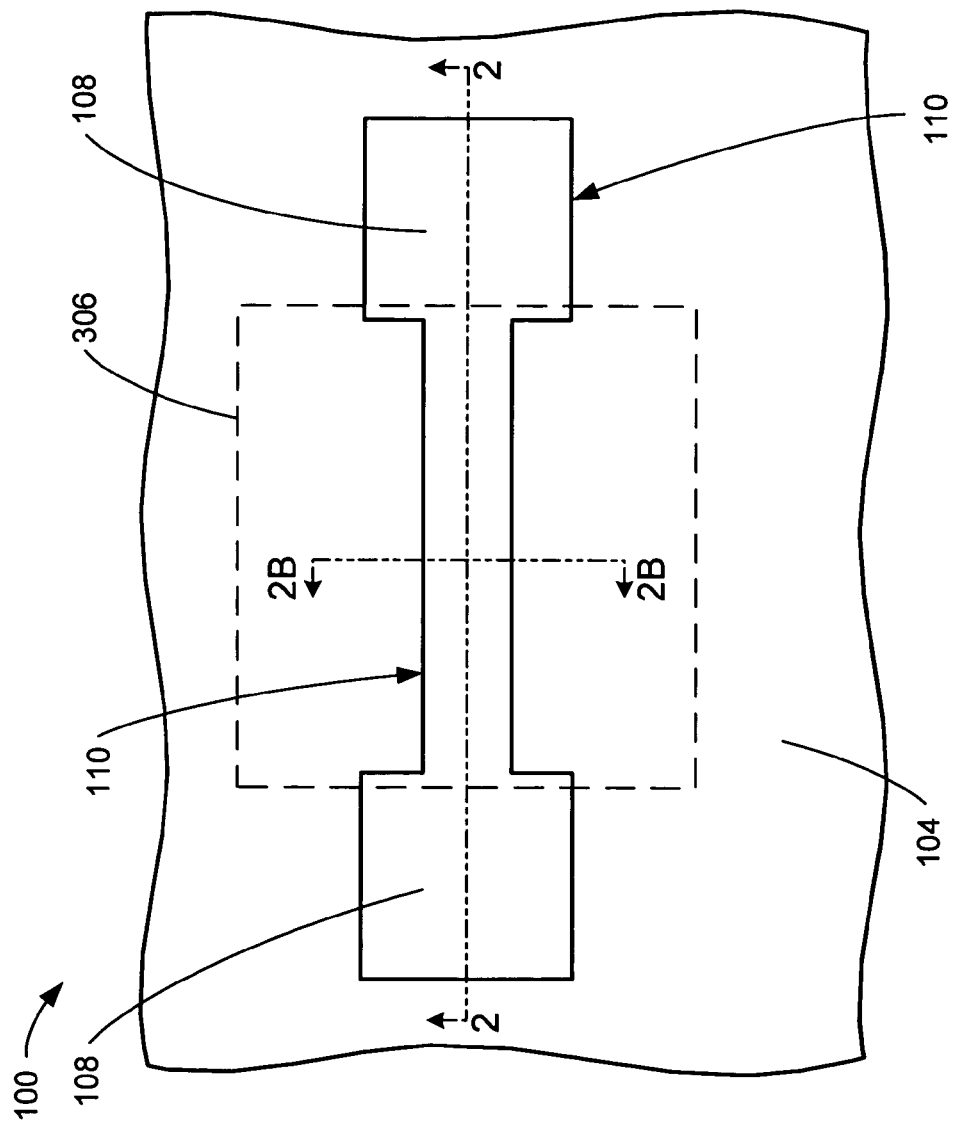
FIG. 2A is a plan view of the structure of FIG. 2 taken generally on view line 2A-2A of FIG. 2.

Referring now to FIG. 2, therein is shown a portion of the structure of FIG. 1, taken generally on line 2-2 of FIG. 2A, following reduction by oxidation of the thickness of the Si layer 106 to 30-100 nm. A hardmask 108, such as silicon oxide ("SiO$_2$"), has been patterned and deposited on the Si layer 106, and the unmasked portions of the Si layer 106 are then etched to the BOX layer 104 to form a horizontal Si fin 110 (see FIGS. 2A and 2B) from the Si layer 106. The remaining wafer layers beneath the horizontal Si fin 110, that is, the Si base 102 and the BOX layer 104, then constitute a semiconductor substrate on which the horizontal Si fin 110 has been formed.

Referring now to FIG. 2A, therein is shown a plan view of the structure of FIG. 2, taken generally on view line 2A-2A thereof, and showing more clearly the horizontal Si fin 110 on top of the wafer 100.

Referring now to FIG. 2B, therein is shown a cross-sectional view of the structure of FIG. 2A, taken generally on line 2B-2B thereof. Also shown in FIG. 2B is a P– implantation (for example, boron or BF$_2$) illustrated by P– implantation arrows 112. The P– implantation, which is performed after removal of the hardmask 108 (as described below), implants the entire horizontal Si fin and forms the P-type channels for the device (e.g., in the sidewall of the horizontal Si fin 110).

Figure 3:
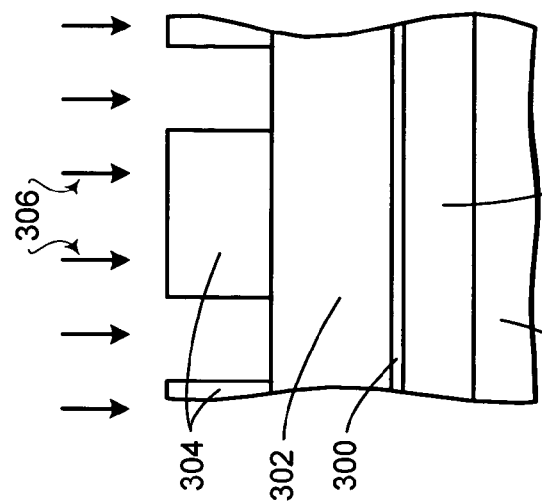
FIG. 3 is a view of a portion of the structure shown in FIG. 2 after removal of the hardmask and further processing in accordance with the present invention.

Referring now to FIG. 3, therein is shown a view of a portion of the structure shown in FIG. 2 after a pre-clean that removes the hardmask 108 (FIG. 2) and cleans the wafer 100 (FIG. 2) and the formations thereon. A gate oxide layer 300 has been grown (or alternatively, may be deposited) on the horizontal Si fin 110. A gate electrode material 302, such as polysilicon, is then deposited on the gate oxide layer 300, and a mask 304 is then patterned and formed on the gate electrode material 302. The portions of the gate electrode material 302 not protected by the mask 304, and which portions will subsequently become an access transistor gate 400 (FIG. 4) and a thyristor gate 402 (FIG. 4), may then receive an N-channel gate dopant implantation represented by N+ implantation arrows 306, when the gate electrode material 302 is polysilicon.

Figure 4A:
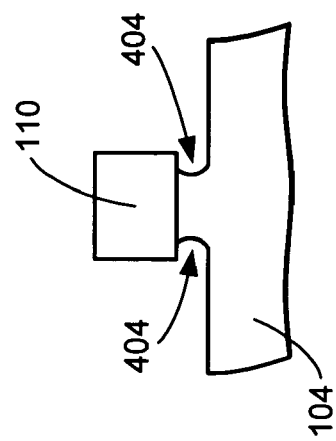
FIG. 4A is a cross-sectional view of the structure of FIG. 4 taken on line 4A-4A of FIG. 4.
Figure 4B:
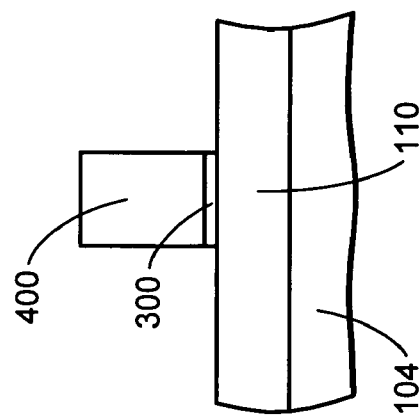
FIG. 4B is a cross-sectional view of the structure of FIG. 4 taken on line 4B-4B of FIG. 4.
Figure 4:
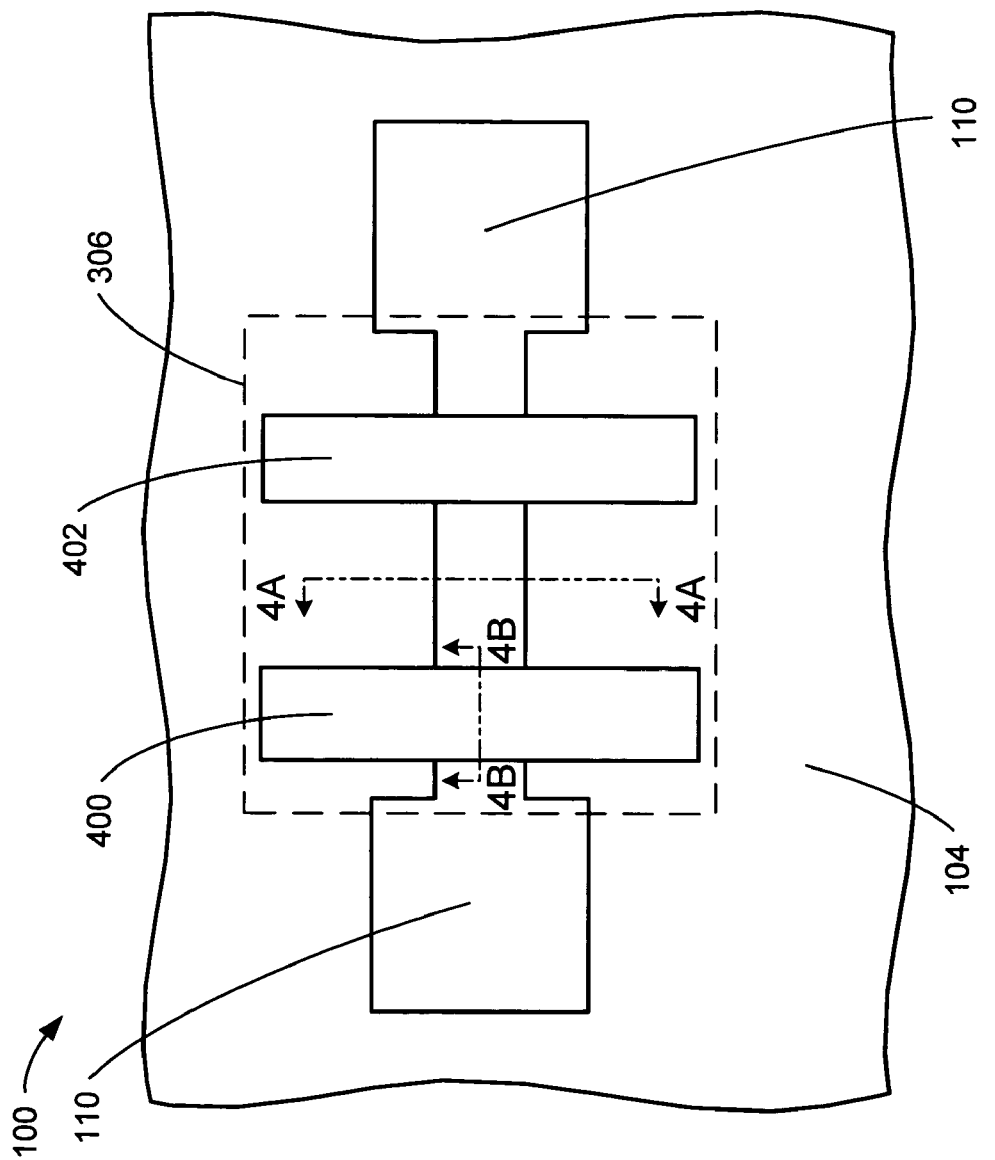
FIG. 4 is a plan view of the structure of FIG. 3 following etching to form an access transistor gate and a thyristor gate.

Referring now to FIG. 4, therein is shown a plan view of the structure of FIG. 3, depicted in the same manner as FIG. 2A, following removal of the mask 304 (FIG. 3), patterning and formation of a complimentary mask (not shown), etching of the gate electrode material 302 (FIG. 3) not protected by the complimentary mask, and removal of the complimentary mask, to form the access transistor gate 400 and the thyristor gate 402 on top of the wafer 100. Both the access transistor gate 400 and the thyristor gate 402, being formed from the gate electrode material 302, are thus formed around and in contact with the horizontal Si fin 110.

Referring now to FIG. 4A, therein is shown a cross-sectional view of the structure shown in FIG. 4, taken on line 4A-4A thereof. In addition to the horizontal Si fin 110 and the BOX layer 104, FIG. 4A also shows an undercut 404 in the BOX layer 104 under each side of the horizontal Si fin 110. The undercuts 404 are a result of the pre-clean processing that removed the hardmask 108 (FIG. 2) prior to growing the gate oxide layer 300 (FIG. 3).

Referring now to FIG. 4B, therein is shown the structure of FIG. 4, taken on line 4B-4B thereof.

Figure 5:
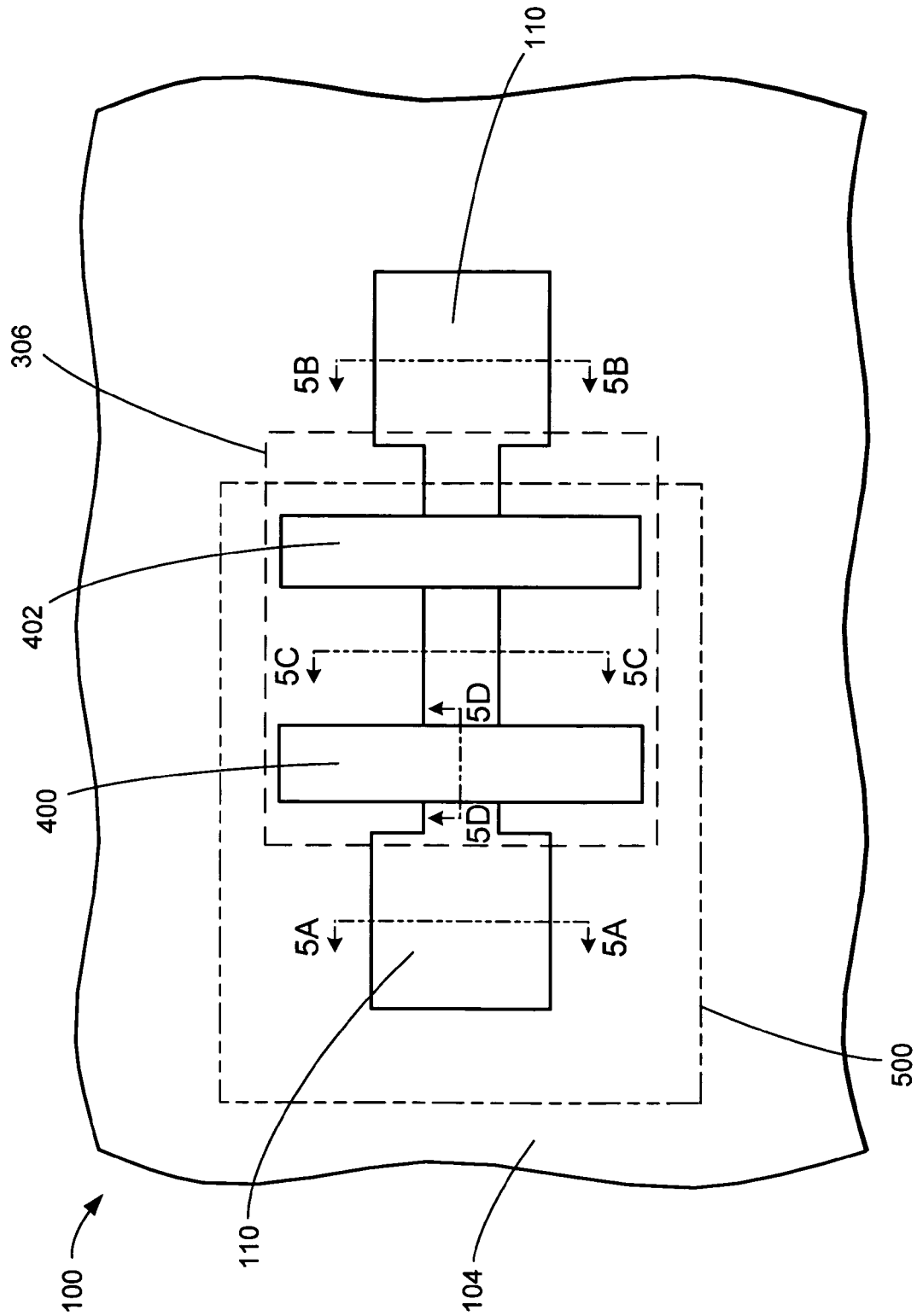
FIG. 5 is a plan view of the structure of FIG. 4 after masking and implantation of an N– lightly doped drain.
Figure 5B:
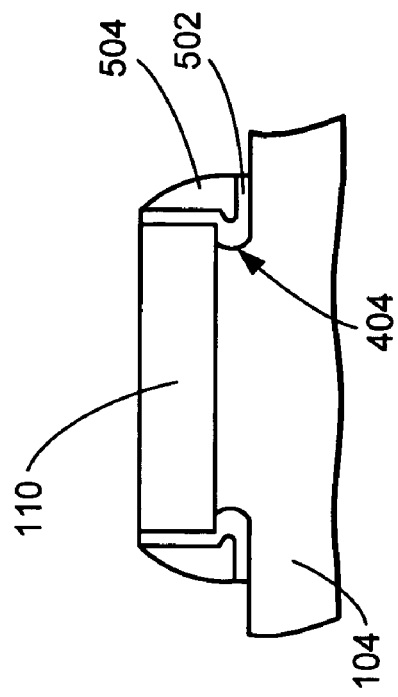
FIG. 5B is a cross-sectional view of the structure of FIG. 5 taken on line 5B-5B of FIG. 5.
Figure 5D:
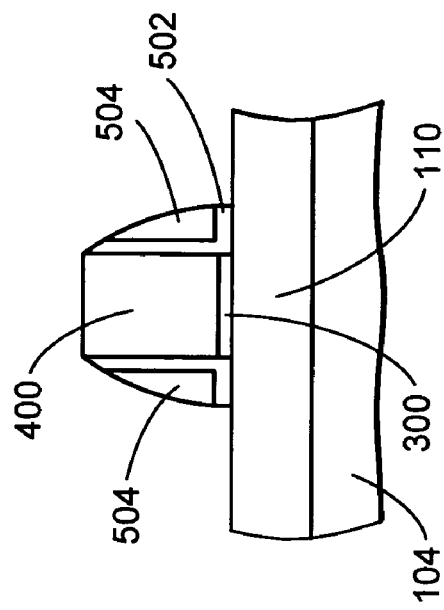
FIG. 5D is a cross-sectional view of the structure of FIG. 5 taken on line 5D-5D of FIG. 5.
Figure 5A:
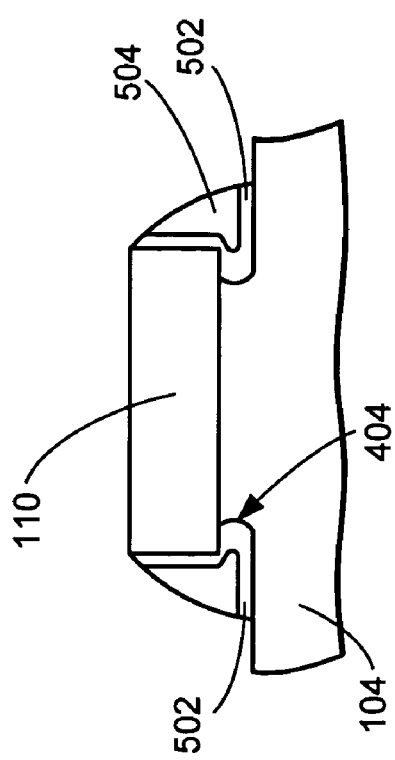
FIG. 5A is a cross-sectional view of the structure of FIG. 5 taken on line 5A-5A of FIG. 5.
Figure 5C:
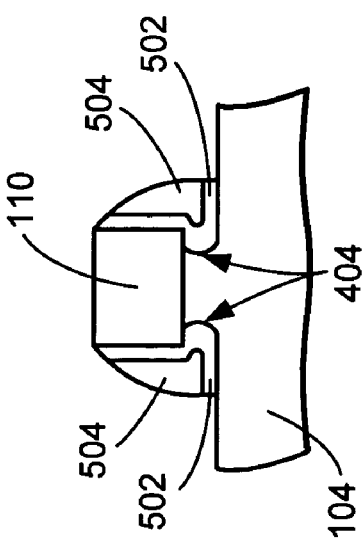
FIG. 5C is a cross-sectional view of the structure of FIG. 5 taken on line 5C-5C of FIG. 5.

Referring now to FIG. 5, therein is shown a plan view of the structure of FIG. 4 following masking and implantation at a small tilt angle (5°-10°) of an N– lightly doped drain implantation 500 ("NLDD") for the negative-channel metal oxide semiconductor ("NMOS") transistor that is represented, at this point, by the access transistor gate 400.

Referring now to FIGS. 5A, 5B, 5C, and 5D, therein is shown the structure of FIG. 5 taken, respectively, on lines 5A-5A, 5B-5B, 5C-5C, and 5D-5D of FIG. 5. Additionally, these FIGS. show a thin SiO$_2$ liner 502 that was originally deposited on the BOX layer 104, the access transistor gate 400, the thyristor gate 402, and the exposed portions of the horizontal Si fin 110. A nitride spacer 504 was then formed on the thin SiO$_2$ liner 502 to protect the sidewalls of the access transistor gate 400, the thyristor gate 402, and the horizontal Si fin 110 against salicidation, and to space the deep source/drain ("S/D") N– implantation (described below) from the channels. The nitride spacer 504 was formed in conventional fashion, for example, by first depositing a nitride spacer layer and then etching the nitride spacer layer to form the nitride spacer 504, the etch also removing the exposed portions of the thin $SiO_2$ liner 502.

Figure 6A:
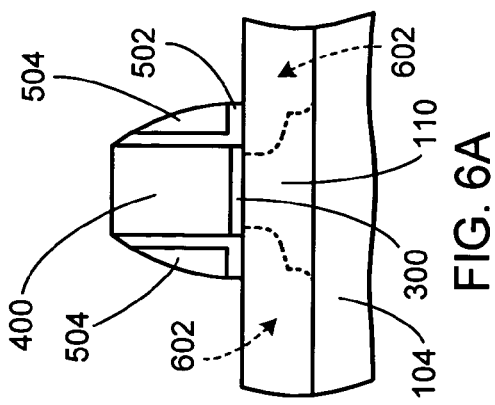
FIG. 6A is a cross-sectional view of the structure of FIG. 6 taken on line 6A-6A of FIG. 6.
Figure 6:
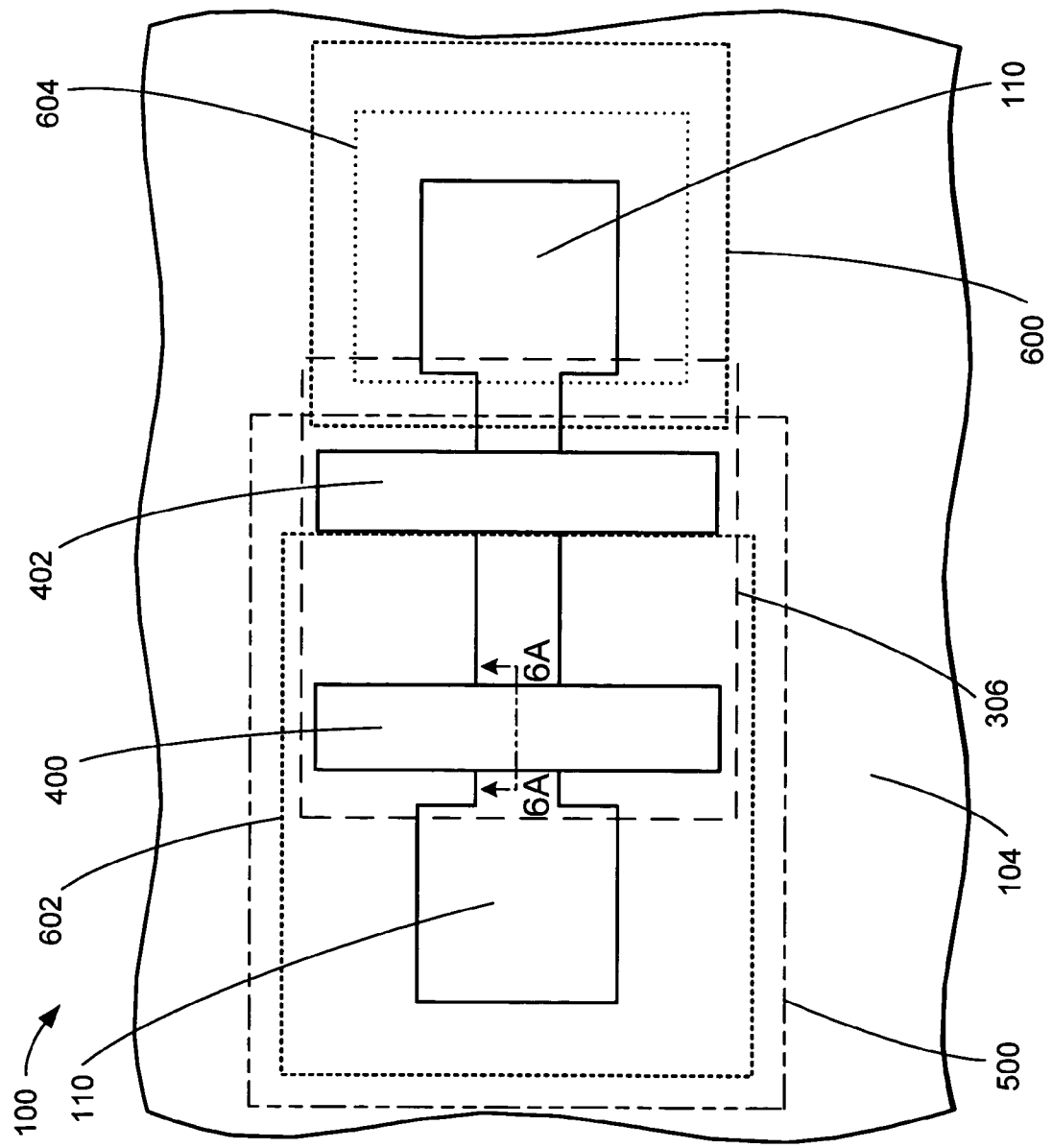
FIG. 6 is a plan view of the structure of FIG. 5 following masking and implantation in accordance with the present invention.

Referring now to FIG. 6, therein is shown a plan view of the structure of FIG. 5 following masking and implantation at a small tilt angle (5°-10°) of a deep N− implantation 600, followed by an N+ implantation 602, followed by a P+ implantation 604. The deep N− implantation 600 is considered "deep" because its implantation is deeper than the P+ implantation 604. The structure then received a rapid thermal anneal ("RTA") to activate the several dopant implantations that have been performed. (The thin $SiO_2$ liner 502 (FIG. 5A) and the nitride spacer 504 (FIG. 5A) have been omitted from FIG. 6 for clarity of illustration.)

Referring now to FIG. 6A, therein is shown a cross-sectional view of the structure of FIG. 6 taken on line 6A-6A thereof.

Figure 7:
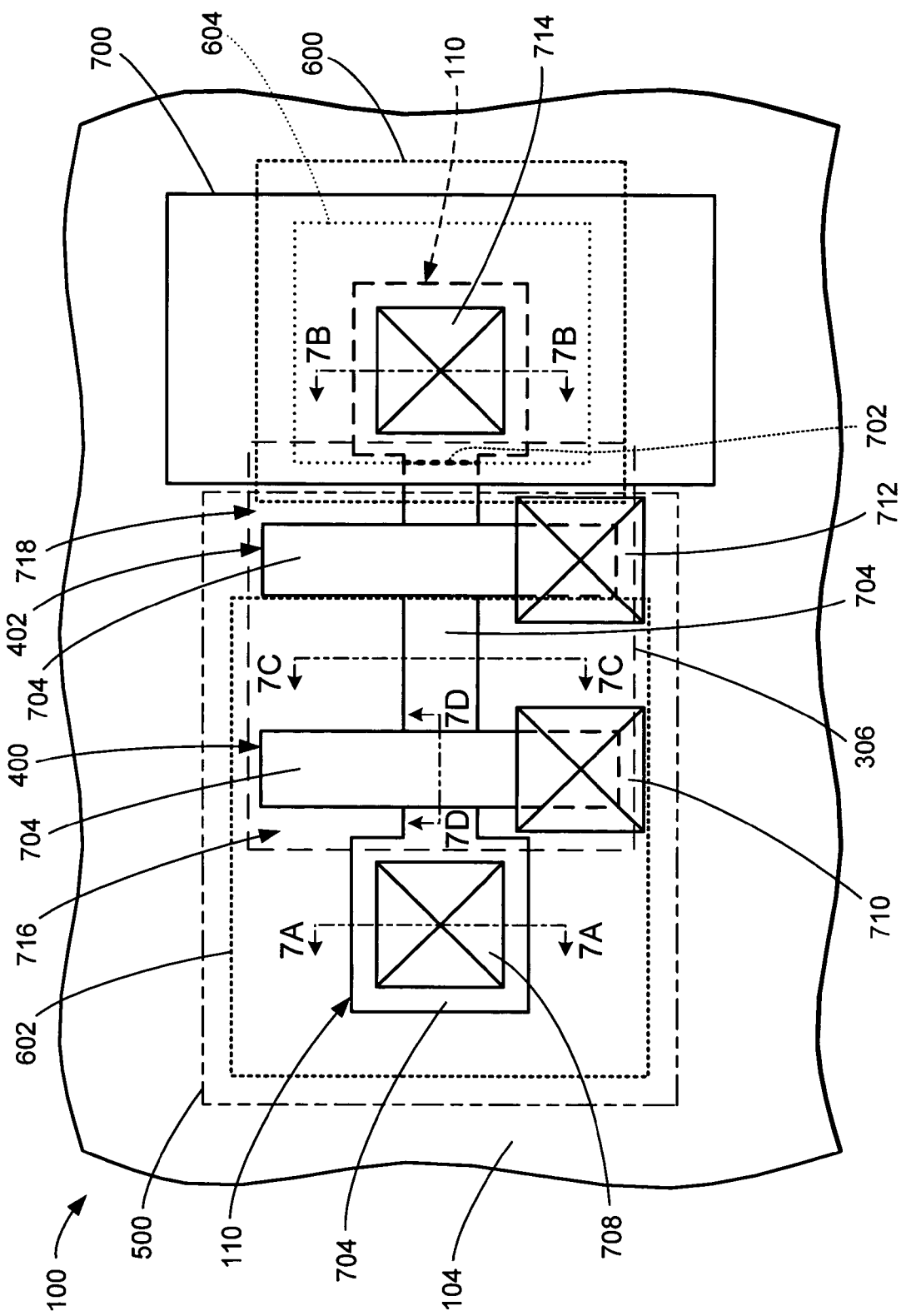
FIG. 7 is a plan view of the structure of FIG. 6 after formation of a salicide block oxide followed by finishing operations in accordance with the present invention.
Figure 7B:
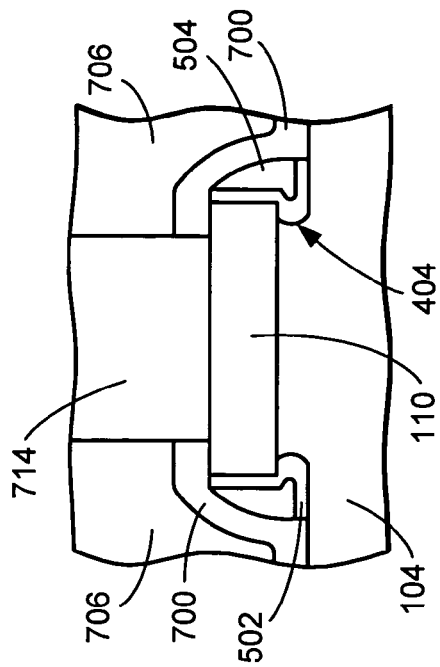
FIG. 7B is a cross-sectional view of the structure of FIG. 7 taken on line 7B-7B of FIG. 7.
Figure 7D:
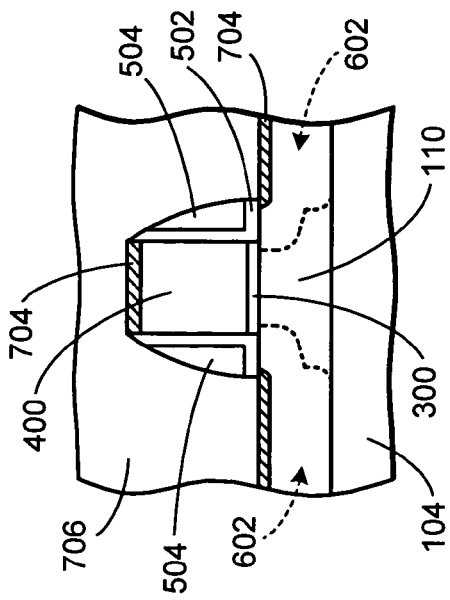
FIG. 7D is a cross-sectional view of the structure of FIG. 7 taken on line 7D-7D of FIG. 7.
Figure 7A:
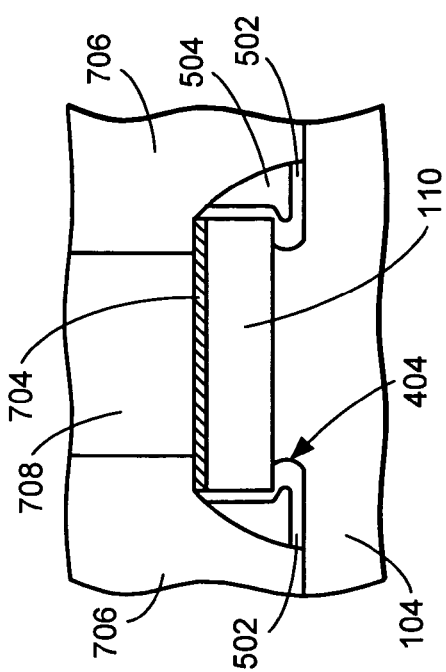
FIG. 7A is a cross-sectional view of the structure of FIG. 7 taken on line 7A-7A of FIG. 7.
Figure 7C:
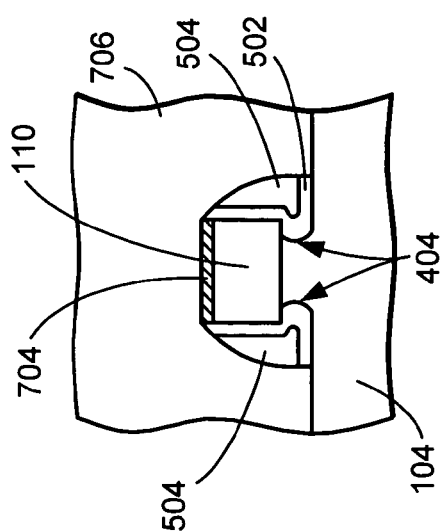
FIG. 7C is a cross-sectional view of the structure of FIG. 7 taken on line 7C-7C of FIG. 7.

Referring now to FIG. 7, therein is shown a plan view of the structure of FIG. 6 following deposition, patterning and masking, etching, and mask removal to form a salicide block oxide 700. The salicide block oxide 700 may be less extensive than illustrated, as long as it covers the P+/N− junction located at the line 702. A salicide layer 704 is then formed on the remaining exposed portions of the horizontal Si fin 110, the access transistor gate 400, and the thyristor gate 402. (The thin $SiO_2$ liner 502 (FIG. 6A) and the nitride spacer 504 (FIG. 6A) have been omitted from FIG. 7 for clarity of illustration.)

The device is then completed by means of an interlayer dielectric ("ILD") layer 706 (omitted from FIG. 7 for clarity of illustration, but shown in FIGS. 7A, 7B, 7C, and 7D, below) and the provision of electrical contacts 708, 710, 712, and 714. The electrical contact 708 is located on the end of the horizontal Si fin 110 nearest the access transistor gate 400, and the electrical contact 714 is located on the opposite end of the horizontal Si fin 110 nearest the thyristor gate 402. The electrical contacts 710 and 712 are for the access transistor gate 400 and the thyristor gate 402, respectively. While not shown in FIG. 7 (and FIGS. 7A, 7B, 7C, and 7D), it will be understood that the various electrical contacts, such as the electrical contacts 708, 710, 712, and 714, will not customarily all be co-planar, which is common practice in the art to enable efficient electrical contacts to be formed in a device having very closely spaced components.

Additional finishing steps include simultaneous provision of other electrical contacts (not shown) as are customary, and finishing with interconnect formation and other conventional finishing steps.

Referring now to FIGS. 7A, 7B, 7C, and 7D, therein is shown the structure of FIG. 7 taken, respectively, on lines 7A-7A, 7B-7B, 7C-7C, and 7D-7D of FIG. 7.

The core components of the access transistor 716 thus formed include the access transistor gate 400, the adjacent portion of the horizontal Si fin 110, and the adjacent portions of the gate oxide layer 300, the NLDD implantation 500, and the N+ implantation 602. Similarly, the core components of the thyristor 718 thus formed include the thyristor gate 402, the portion of the horizontal Si fin 110 in the vicinity thereof, and the adjacent portions of the gate oxide layer 300, the NLDD implantation 500, the N+ implantation 602, the deep N− implantation 600, and the P+ implantation 604. The access transistor 716 in this structure is thus in contact with the thyristor 718 for control thereof.

Figure 8:
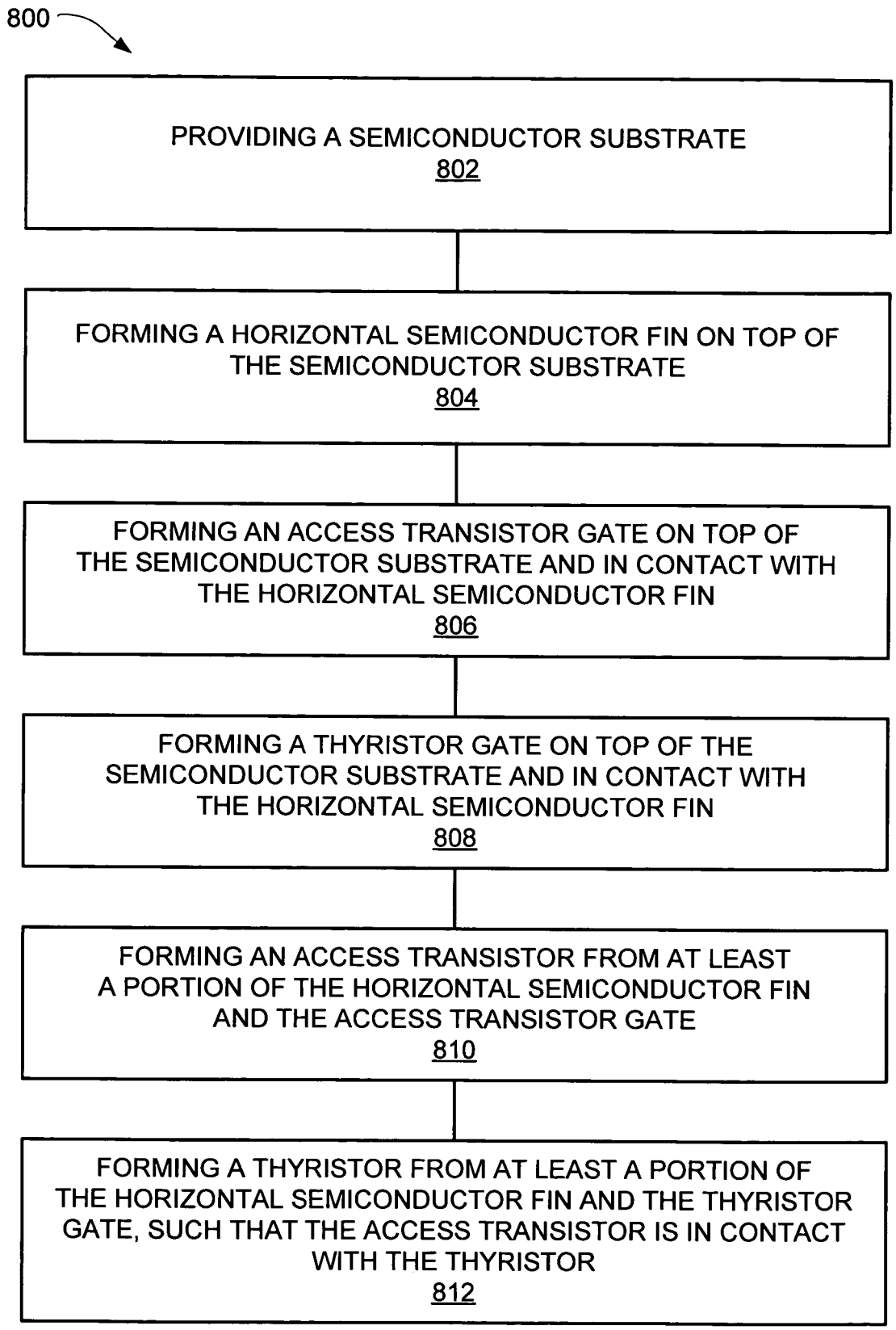
FIG. 8 is a flow chart of a method for manufacturing an integrated circuit structure in accordance with the present invention.

Referring now to FIG. 8, therein is shown a flow chart of a method 800 for manufacturing an integrated circuit structure in accordance with the present invention. The method includes a step 802 of providing a semiconductor substrate; a step 804 of forming a horizontal semiconductor fin on top of the semiconductor substrate; a step 806 of forming an access transistor gate on top of the semiconductor substrate and in contact with the horizontal semiconductor fin; a step 808 of forming a thyristor gate on top of the semiconductor substrate and in contact with the horizontal semiconductor fin; a step 810 of forming an access transistor from at least a portion of the horizontal semiconductor fin and the access transistor gate; and a step 812 of forming a thyristor from at least a portion of the horizontal semiconductor fin and the thyristor gate, such that the access transistor is in contact with the thyristor.

In greater detail, a manufacturing method to produce the thyristor-based SRAM according to the present invention is performed as follows:

1. The wafer 100 is suitably prepared, having a P-type SOI configuration consisting of the Si base 102, the BOX layer 104, and the Si layer 106 thereon. (FIG. 1)
2. The thickness of the Si layer 106 of the SOI wafer is reduced to 30-100 nm by oxidation. The hardmask 108 is then deposited and patterned, and the Si layer 106 is etched to form the horizontal Si fin 110 on top of the BOX layer 104. Masking and implantation of the P-type channels (in the sidewalls of the horizontal Si fin 110) are then performed, as indicated by the P− implantation arrows 112. (FIGS. 2, 2A, and 2B)
3. After a pre-clean that also removes the hardmask 108, the gate oxide layer 300 is grown or deposited, as preferred, for the complimentary metal oxide semiconductor ("CMOS") process being utilized. The gate electrode material 302 is then deposited. When polysilicon is used as the gate electrode material 302, masking and implantation doping with phosphorus for N− channel gates is then performed, as indicated by the mask 304 and the N+ implantation arrows 306. (FIG. 3)
4. The gate electrode material 302 (FIG. 3) is then patterned and etched to form the access transistor gate 400 and the thyristor gate 402. (FIGS. 4, 4A, and 4B)
5. The NLDD implantation 500 of the NMOS transistors is then masked and implanted. The thin $SiO_2$ liner 502 is then deposited, followed by a nitride spacer layer that is then etched to form the nitride spacer 504. The nitride spacer 504 protects the sidewalls of the horizontal Si fin 110, the access transistor gate 400, and the thyristor gate 402 against salicidation. (FIGS. 5, 5A, 5B, 5C, and 5D)
6. Several more implantations are then performed, in particular, the deep N− implantation 600, followed by the N+ implantation 602, and the P+ implantation 604. RTA is then performed to activate all the implantations. (FIGS. 6 and 6A)
7. The salicide block oxide 700 is then deposited, patterned, and etched so that the P+/N− junction at the line 702 is covered. The salicide layer 704 is then formed, following which the ILD layer 706 is deposited thereover. The electrical contacts, including electrical contacts 708, 710, 712, and 714, are then formed through the ILD layer 706, followed by CMP and other conventional finishing steps for the device. (FIGS. 7, 7A, 7B, 7C, and 7D)

It has been discovered that the present invention has numerous advantages. Principal among these is the compatibility of the present invention with conventional CMOS processing.

A particular advantage is that the present invention integrates the T-RAM into a CMOS FinFET process with only one additional masking step (for the thyristor N− implantation).

The present invention also maintains the surround-gate and thin-body features for the thyristor (for fast turn-off speed) while taking advantage of the area and speed advantages of the FinFET architecture.

The invention further provides a static read/write random-access memory ("SRAM") design utilizing an NMOS T-RAM for ultra-high cell density.

Epitaxy is not required because the T-RAM is fabricated horizontally by forming its NPNP semiconductor material layers utilizing a horizontal fin.

The resulting process is straightforward, economical, uncomplicated, highly versatile, uses conventional technologies, and is thus readily suited for manufacturing ultra-high cell density devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hitherto-fore set forth herein or shown in the accompanying drawings are to be interpreted in an illustrative and non-limiting sense.

The invention claimed is:

1. An integrated circuit structure, comprising:
   a semiconductor substrate;
   a horizontal semiconductor fin on top of the semiconductor substrate;
   an access transistor gate on top of the semiconductor substrate and in contact with the horizontal semiconductor fin;
   a thyristor gate on top of the semiconductor substrate and in contact with the horizontal semiconductor fin;
   an access transistor formed from at least a portion of the horizontal semiconductor fin and the access transistor gate; and
   a thyristor formed from at least a portion of the horizontal semiconductor fin and the thyristor gate, the access transistor being in contact with the thyristor.

2. The structure of claim 1 wherein the semiconductor substrate and the horizontal semiconductor fin further comprise a silicon-on-insulator wafer in which the horizontal semiconductor fin is formed from the top silicon layer of the silicon-on-insulator wafer.

3. The structure of claim 1 wherein both the access transistor gate and the thyristor gate are formed around at least a portion of the horizontal semiconductor fin.

4. The structure of claim 1 further comprising a liner and a spacer formed around at least portions of the horizontal semiconductor fin, the access transistor gate, and the thyristor gate.

5. The structure of claim 1 further comprising:
   an interlayer dielectric layer over at least the access transistor and the thyristor; and
   at least one electrical contact through the interlayer dielectric layer to the access transistor and at least one electrical contact through the interlayer dielectric layer to the thyristor.

6. An integrated circuit structure, comprising:
   a silicon-on-insulator semiconductor wafer;
   a horizontal semiconductor fin etched from the top silicon layer of the silicon-on-insulator semiconductor wafer;
   an access transistor gate on top of the semiconductor wafer and formed around and in contact with the horizontal semiconductor fin;
   a thyristor gate on top of the semiconductor wafer and formed around and in contact with the horizontal semiconductor fin;
   an access transistor formed from at least a portion of the horizontal semiconductor fin and the access transistor gate; and
   a thyristor formed from at least a portion of the horizontal semiconductor fin and the thyristor gate, such that the access transistor is in contact with the thyristor.

7. The structure of claim 6 further comprising an N− lightly doped drain implantation implanted into at least a portion of the horizontal semiconductor fin and an N+ implantation implanted into at least a portion of the horizontal semiconductor fin.

8. The structure of claim 6 wherein the thyristor further comprises a deep N− implantation implanted into at least a portion of the horizontal semiconductor fin, followed by a P+ implantation implanted into at least a portion of the horizontal semiconductor fin.

9. The structure of claim 6 further comprising a liner and a spacer formed around at least portions of the horizontal semiconductor fin, the access transistor gate, and the thyristor gate.

10. The structure of claim 6 further comprising:
    an interlayer dielectric layer over at least the access transistor and the thyristor; and
    at least one electrical contact through the interlayer dielectric layer to the access transistor and at least one electrical contact through the interlayer dielectric layer to the thyristor.

* * * * *